United States Patent
Li et al.

(10) Patent No.: US 11,784,465 B2
(45) Date of Patent: Oct. 10, 2023

(54) SEMICONDUCTOR LASER BEAM COMBINING DEVICE

(71) Applicant: II-VI Suwtech, Inc., Shanghai (CN)

(72) Inventors: Dashan Li, Shanghai (CN); Yaping Zhao, Shanghai (CN); Qian Zhang, Shanghai (CN); Quan Zhou, Shanghai (CN)

(73) Assignee: II-VI Suwtech, Inc., Shanghai (CN)

( * ) Notice: Subject to any disclaimer, the term of this patent is extended or adjusted under 35 U.S.C. 154(b) by 581 days.

(21) Appl. No.: 17/043,857

(22) PCT Filed: Oct. 10, 2018

(86) PCT No.: PCT/CN2018/109579
§ 371 (c)(1),
(2) Date: Sep. 30, 2020

(87) PCT Pub. No.: WO2019/205500
PCT Pub. Date: Oct. 31, 2019

(65) Prior Publication Data
US 2021/0066890 A1    Mar. 4, 2021

(30) Foreign Application Priority Data

Apr. 28, 2018  (CN) .......................... 201810401368.7

(51) Int. Cl.
*H01S 5/40*    (2006.01)
*H01S 5/028*   (2006.01)
*H01S 5/14*    (2006.01)

(52) U.S. Cl.
CPC ............ *H01S 5/4012* (2013.01); *H01S 5/028* (2013.01); *H01S 5/141* (2013.01); *H01S 5/4062* (2013.01)

(58) Field of Classification Search
CPC ................................................. G02B 27/0944
See application file for complete search history.

(56) References Cited

U.S. PATENT DOCUMENTS

2013/0342885 A1* 12/2013 Kono ........................ G02B 5/32
                                                   359/15
2017/0082863 A1*  3/2017 Marciante ............ G02B 17/086

FOREIGN PATENT DOCUMENTS

CN     103081261       5/2013
CN     104332821 A     2/2015
(Continued)

OTHER PUBLICATIONS

International search report for PCT/CN2018/109579 dated Jan. 23, 2019.

*Primary Examiner* — Tuan N Nguyen
(74) *Attorney, Agent, or Firm* — Qinghong Xu

(57) ABSTRACT

A semiconductor laser beam combining device includes at least two modular laser input equipments, a second diffraction grating, and an output coupler. The modular laser input equipment includes a semiconductor laser, a beam shaping component, a transformation lens, and a first diffraction grating arranged along an optical path in sequence. The semiconductor laser generates a beam. The semiconductor laser is located at a front focal point of the transformation lens. The first diffraction grating is located in front of a back focal point of the transformation lens. Each beam is gathered by the transformation lens and diffracted by the first diffraction grating to the second diffraction grating. Each beam is combined at an identical position and an identical diffraction angle on the second diffraction grating to generate a combined beam. The combined beam from the second diffraction grating enters the output coupler vertically and is outputted by the output coupler.

12 Claims, 3 Drawing Sheets

(56) References Cited

FOREIGN PATENT DOCUMENTS

| CN | 104901149 A | 9/2015 |
| CN | 106532435 A | 3/2017 |
| CN | 106684702 A | 5/2017 |
| CN | 106711753 A | 5/2017 |
| CN | 108321677 A | 7/2018 |
| CN | 208062488 U | 11/2018 |

\* cited by examiner

SEMICONDUCTOR LASER BEAM COMBINING DEVICE

CROSS REFERENCE

This application is based upon PCT patent application No. PCT/CN2018/109579 filed on Oct. 10, 2018, which claims priority to Chinese Patent Application No. 201810401368.7, filed on Apr. 28, 2018, the entire contents thereof are incorporated herein by reference.

TECHNICAL FIELD

The present disclosure elates to the field of laser equipment, specifically to a semiconductor laser beam combining device.

BACKGROUND

Since a semiconductor laser has advantages of low cost, long life, small size, high reliability, and so on, the semiconductor laser can be widely used in industrial processing, pump, medical, communication, and so on. A significant factor of developing the semiconductor laser depends upon how to further enhance brightness of the semiconductor laser. The brightness of laser beam is determined by output power and beam quality. The larger the power is, the better the beam quality is and the higher the brightness is. Consequently, the semiconductor laser can be used more widely.

The beam combining technique is usually used to implement the semiconductor laser with high brightness. The conventional beam combining technique includes beam shaping, polarization beam combining, and wavelength beam combining. The beam shaping is used to enhance beam quality by balancing beam parameter product in direction of fast and slow axes, but the brightness of laser is not enhanced. The polarization beam combining is used to combine beams of two polarization directions into one beam, but the brightness is enhanced to twice only. Due to the limitation of coating technique, the number of beam combining units used in the wavelength beam combining is usually not more than 5 and the power and brightness cannot be enhanced effectively.

Spectral beam combining is a new semiconductor laser beam combining technique. Daneu V et al. discloses and depicts this method in detail (see Daneu V, Sanchez A, Fan T Y et al. Spectral beam combining of a broad-stripe diode laser array in an external cavity. [J]. Optics Letters, 2000, 25(6):405-7). The spectral beam combining keeps each beam emitting unit at different wavelengths by external cavity feedback and grating dispersion, so as to obtain identical diffraction angle and achieve beam combining. The spectral beam combining has two advantages. First, the beams outputted by multiple single-tube semiconductor lasers are combined to superimpose the power and the beam quality can be kept as high beam quality of one single beam emitting unit simultaneously, such that the brightness of the semiconductor laser is enhanced greatly. Second, multiple beam emitting units can share a beam combining component, so the cost can be reduced substantially regardless of the number of beam combining components and the method will has superiority in use. Accordingly, the spectral beam combining technique has become a significant issue in high power semiconductor laser field.

SUMMARY

In the light of the problems of the prior art, an objective of the present disclosure is to provide a semiconductor laser beam combining device to solve the problems of the prior art. The present disclosure enhances output power and brightness by combining multiple spectral beams and uses multiple grating structures to compress spectrum and reduce spectral width.

In one embodiment of the present disclosure, a semiconductor laser beam combining device comprises at least two modular laser input equipments, a second diffraction grating, and an output coupler. Each of the modular laser input equipments comprises a semiconductor laser, a beam shaping component, a transformation lens, and a first diffraction grating arranged along an optical path in sequence. The semiconductor laser generates a beam. The semiconductor laser is located at a front focal point of the transformation lens. The first diffraction grating is located in front of a back focal point of the transformation lens. Each beam is gathered by the transformation lens and diffracted by the first diffraction grating to the second diffraction grating. Each beam is combined at an identical position and an identical diffraction angle on the second diffraction grating to generate a combined beam. The combined beam from the second diffraction grating enters the output coupler vertically and is outputted by the output coupler.

In one embodiment of the present disclosure, an output optical axis of the semiconductor laser of each of the modular laser input equipments is parallel to each other.

In one embodiment of the present disclosure, the semiconductor laser is one selected from a group consisting of a single semiconductor laser beam emitting unit, a one-dimensional semiconductor laser bar array, and a two-dimensional semiconductor laser stack array.

In one embodiment of the present disclosure, the first diffraction grating and the second diffraction grating are transmission gratings.

In one embodiment of the present disclosure, the first diffraction grating and the second diffraction grating are reflection gratings.

In one embodiment of the present disclosure, the first diffraction grating is a transmission grating and the second diffraction grating is a reflection grating.

In one embodiment of the present disclosure, the first diffraction grating is a reflection grating and the second diffraction grating is a transmission grating.

In one embodiment of the present disclosure, an antireflection film is coated on a front surface of the semiconductor laser, a reflectivity of the antireflection film is smaller than 1%, a high reflective film is coated on a back surface of the semiconductor laser, and a reflectivity of the high reflective film is larger than 95%.

In one embodiment of the present disclosure, the beam shaping component is one selected from a group consisting of a fast axis collimator, a combination of a fast axis collimator and a slow axis collimator, and a combination of a fast axis collimator and a 45-degree tilted cylindrical lens.

In one embodiment of the present disclosure, a diffraction efficiency of the first diffraction grating and the second diffraction grating at 1 order or −1 order is larger than 90%.

In one embodiment of the present disclosure, the transformation lens is one selected from a group consisting of a single spherical cylindrical lens, a lens set consisting of multiple spherical cylindrical lenses, a single non-spherical cylindrical lens, and a lens set consisting of multiple non-spherical cylindrical lenses.

In one embodiment of the present disclosure, the output coupler is a partial reflector and a reflectivity of the output coupler is between 5% and 30%.

As mentioned in the above, the semiconductor laser beam combining device of the present disclosure enhances output power and brightness by combining multiple spectral beams and uses multiple grating structures to compress spectrum, such that the spectral width can be controlled within a gain range of a semiconductor gain medium and within a high efficient diffraction range of a grating.

BRIEF DESCRIPTION OF THE DRAWINGS

Embodiments of the present disclosure will now be described, by way of example only, with reference to the accompanying schematic drawings in which corresponding reference symbols indicate corresponding parts, and in which.

DETAILED DESCRIPTION

In the following, embodiments of the present disclosure will be described in detail referring to figures. The concept and its realizations of the present disclosure can be implemented in a plurality of forms, and should not be understood to be limited to the embodiments described hereafter. In contrary, these embodiments are provided to make the present disclosure more comprehensive and understandable, and so the conception of the embodiments can be conveyed to the technicians in the art fully. Same reference signs in the figures refer to same or similar structures, so repeated description of them will be omitted.

Figure 1:
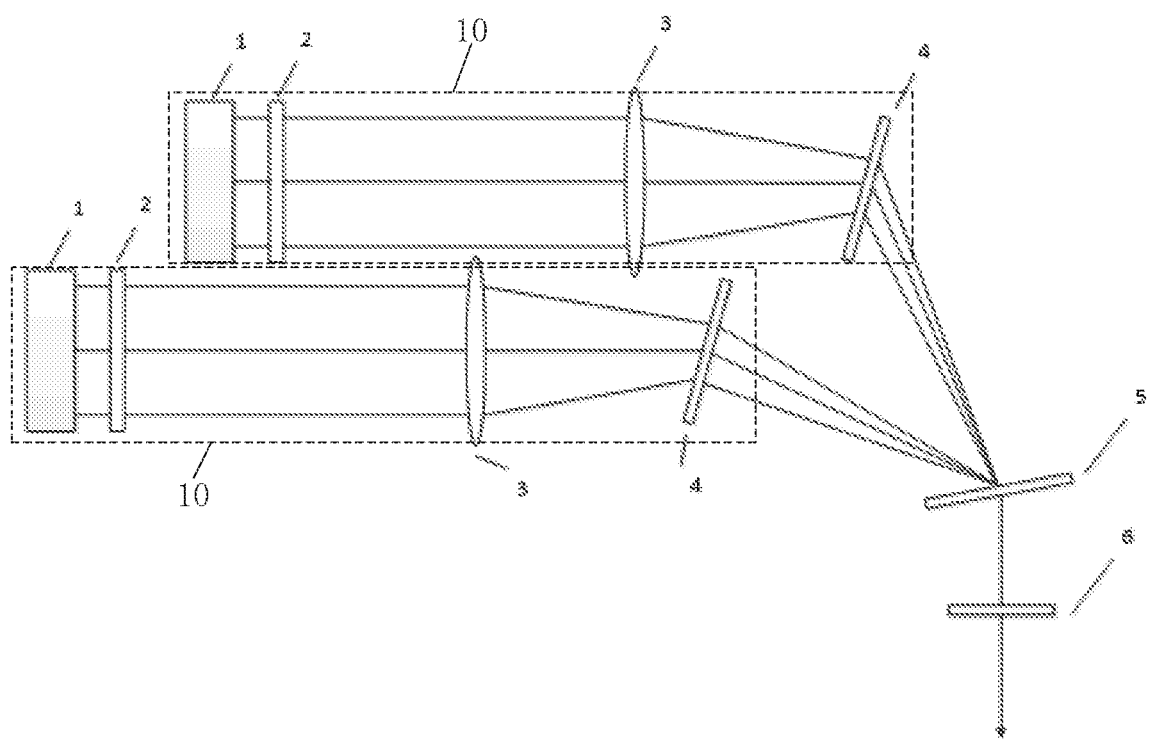
FIG. 1 shows a schematic view of a semiconductor laser beam combining device of an embodiment of the present disclosure.

FIG. 1 shows a schematic view of a semiconductor laser beam combining device of an embodiment of the present disclosure. As shown in FIG. 1, the semiconductor laser beam combining device of the present disclosure comprises two modular laser input equipments 10, a second transmission diffraction grating 5, and an output coupler 6. Each of the modular laser input equipments 10 comprises a semiconductor laser 1, a beam shaping component 2, a transformation lens 3, and a first transmission diffraction grating 4 arranged along an optical path in sequence, wherein the semiconductor laser 1 generates a beam. The semiconductor laser 1 is located at a front focal point of the transformation lens 3. The first transmission diffraction grating 4 is located in front of a back focal point of the transformation lens 3. Each beam is gathered by the transformation lens 3 and diffracted by the first transmission diffraction grating 4 to the second transmission diffraction grating 5. Each beam is combined at an identical position and an identical diffraction angle on the second transmission diffraction grating 5 to generate a combined beam. The combined beam from the second transmission diffraction grating 5 enters the output coupler 6 vertically and is outputted by the output coupler 6. An output optical axis of the semiconductor laser 1 of each of the modular laser input equipments 10 is parallel to each other. The semiconductor laser 1 is, but not limited to, a single semiconductor laser beam emitting unit. In other embodiments, the semiconductor laser 1 may be a one-dimensional semiconductor laser bar array or a two-dimensional semiconductor laser stack array. An output optical axis of the Output coupler 6 is perpendicular to the output optical axis of the semiconductor laser 1, but is not so limited. The semiconductor laser beam combining device of the present disclosure is not limited to two modular laser input equipments 10. According to practical optical requirement, the present disclosure may add the number of modular laser input equipments 10 to enhance laser intensity, such as ten modular laser input equipments or thirty modular laser input equipments.

The principle of the present disclosure is depicted in the following. Each beam is gathered by the transformation lens 3 and diffracted by the first transmission diffraction grating 4 to the second transmission diffraction grating 5. Each beam is combined at an identical position and an identical diffraction angle on the second transmission diffraction grating 5 to generate a combined beam (i.e. multiple beams are diffracted by the second transmission diffraction grating 5 and then combined to generate a single beam). The combined beam from the second transmission diffraction grating 5 enters the output coupler 6 vertically and is outputted by the output coupler 6. The output optical axes of the semiconductor lasers 1 of the two modular laser input equipments 10 are parallel to each other. By means of using the first transmission diffraction grating 4 and the second transmission diffraction grating 5 to be diffraction components, the present disclosure may enhance dispersion effect to twice. When the present disclosure is used to combine multiple beams of multiple semiconductor lasers, the spectral width can be reduced and more beam combining units can be added within a gain range of a semiconductor laser gain material and within a high efficient diffraction range of a grating, so as to enhance output power. The first diffraction grating and the second diffraction grating are, but not limited to, transmission gratings, so as to satisfy requirements of different optical structures.

In one embodiment of the present disclosure, the first diffraction grating and the second diffraction grating are, but not limited to, reflection gratings, so as to satisfy requirements of different optical structures. In one embodiment of the present disclosure, the first diffraction grating is, but not limited to, a transmission grating and the second diffraction grating is, but not limited to, a reflection grating, so as to satisfy requirements of different optical structures. In one embodiment of the present disclosure, the first diffraction grating is, but not limited to, a reflection grating and the second diffraction grating is, but not limited to, a transmission grating, so as to satisfy requirements of different optical structures.

In one embodiment of the present disclosure, an antireflection film is coated on a front surface of the semiconductor laser 1, a reflectivity of the antireflection film is smaller than 1%, a high reflective film is coated on a back surface of the semiconductor laser 1, and a reflectivity of the high reflective film is larger than 95%, so as to satisfy different optical requirements, but is not so limited.

In one embodiment of the present disclosure, the beam shaping component 2 is one selected from a group consisting of a fast axis collimator, a combination of a fast axis collimator and a slow axis collimator, and a combination of a fast axis collimator and a 45-degree tilted cylindrical lens, so as to satisfy different optical requirements, but is not so limited.

In one embodiment of the present disclosure, a diffraction efficiency of the first diffraction grating and the second diffraction grating at 1 order or −1 order is larger than 90%.

In one embodiment of the present disclosure, the transformation lens 3 is one selected from a group consisting of a single spherical cylindrical lens, a lens set consisting of multiple spherical cylindrical lenses, a single non-spherical cylindrical lens, and a lens set consisting of multiple non-spherical cylindrical lenses, so as to satisfy different optical requirements, but is not so limited.

In one embodiment of the present disclosure, the output coupler 6 is a partial reflector and a reflectivity of the output coupler 6 is between 5% and 30%, so as to satisfy different optical requirements, but is not so limited.

The main difference between the present disclosure and the prior art is depicted in the following. Although the beam combining device has two gratings, only one of the two gratings functions as the transmission lens for gathering multiple beams to one point and only the second grating is used to diffract the beam. The method of the prior art cannot compress the spectral width. The diffraction effect of one single grating is limited and the spectral width of the laser cannot be compressed after beam combining, such that the spectral width is larger after beam combining. However, the first diffraction grating 4 and the second diffraction grating 5 of the present disclosure both can be used to diffract the beam, i.e. both of the two diffraction gratings can compress the spectral width. Accordingly, more beam combining units can be added within a specific gain range, so as to enhance spectral beam combining power and brightness.

Figure 2:
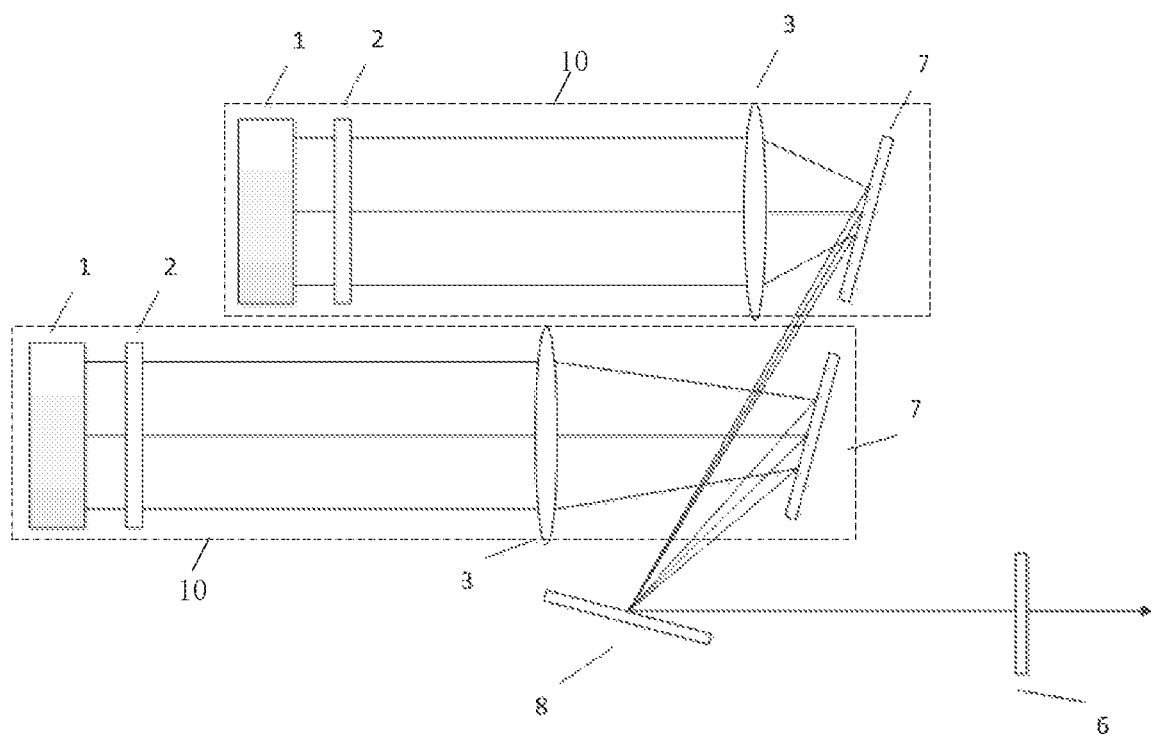
FIG. 2 shows a schematic view of a semiconductor laser beam combining device of another embodiment of the present disclosure.
Figure 3:
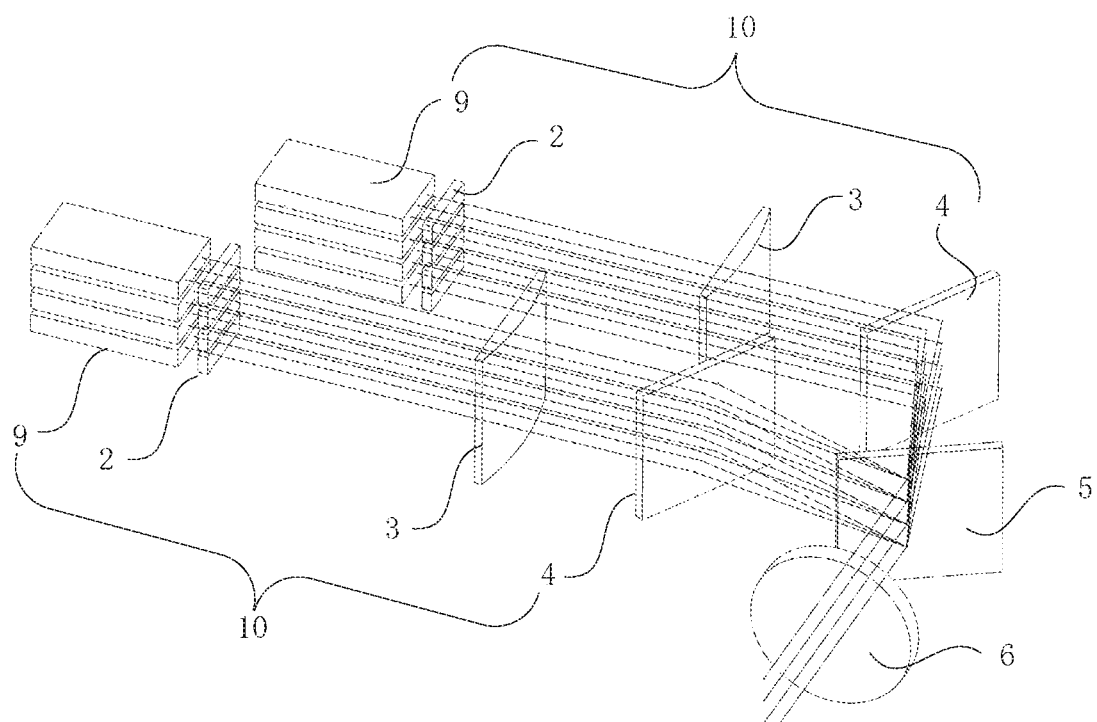
FIG. 3 shows a schematic view of a semiconductor laser beam combining device of another embodiment of the present disclosure.

In the following, FIGS. 2 and 3 show two exemplary embodiments in accordance with FIG. 1.

FIG. 2 shows a schematic view of a semiconductor laser beam combining device of another embodiment of the present disclosure. As shown in FIG. 2, the semiconductor laser beam combining device of the present disclosure comprises two modular laser input equipments 10, a second reflection diffraction grating 8, and an output coupler 6, but is not so limited. Each of the modular laser input equipments 10 comprises a semiconductor laser 1, a beam shaping component 2, a transformation lens 3, and a first reflection diffraction grating 7. Each semiconductor laser 1 corresponds to respective beam shaping component 2, transformation lens 3, and first reflection diffraction grating 7, but is not so limited. The semiconductor laser beam combining device of the present disclosure may also comprise multiple semiconductor laser. The semiconductor laser is located at a front focal point of the transformation lens 3. The first reflection diffraction grating 7 is located in front of a back focal point of the transformation lens 3. The semiconductor laser 1 is a single-tube semiconductor laser. An antireflection film is coated on a front surface of the semiconductor laser 1, a reflectivity of the antireflection film is smaller than 1%, a high reflective film is coated on a back surface of the semiconductor laser 1, and a reflectivity of the high reflective film is larger than 95%. Each beam is withered by the transformation lens 3 and diffracted by the first reflection diffraction grating 7 to the second diffraction grating 8. Each beam is combined at an identical position and an identical diffraction angle on the second reflection diffraction grating 8 to generate a combined beam (i.e. multiple beams are diffracted by the second reflection diffraction grating 8 and then combined to generate a single beam). The combined beam from the second reflection diffraction grating 8 enters the output coupler 6 vertically and is outputted by the output coupler 6. The output optical axes of the semiconductor lasers 1 of the two modular laser input equipments 10 are parallel to each other. An output optical axis of the output coupler 6 is parallel to the output optical axis of the semiconductor laser 1, but is not so limited.

By means of using the first reflection diffraction grating 7 and the second reflection diffraction grating 8 to be diffraction components, the present disclosure may enhance dispersion effect to twice. When the present disclosure is used to combine multiple beams of multiple semiconductor lasers, the spectral width can be reduced and more beam combining units can be added within a gain range of a semiconductor laser gain material and within a high efficient diffraction range of a grating, so as to enhance output power.

FIG. 3 shows a schematic view of a semiconductor laser beam combining device of another embodiment of the present disclosure. As shown in FIG. 3, the semiconductor laser beam combining device of the present disclosure comprises two modular laser input equipments 10, a second transmission diffraction grating 5, and an output coupler 6. Each of the modular laser input equipments 10 comprises a semiconductor laser 9, a beam shaping component 2, a transformation lens 3, and a first transmission diffraction grating 4 arranged along an optical path in sequence, wherein the semiconductor laser 9 generates a beam. The semiconductor laser 9 is located at a front focal point of the transformation lens 3. The first transmission diffraction grating 4 is located in front of a back focal point of the transformation lens 3. In this embodiment, each semiconductor laser 9 is, but not limited to, a two-dimensional semiconductor laser stack array. The output optical axes of the semiconductor lasers 9 of the two modular laser input equipments 10 are parallel to each other. An output optical axis of the output coupler 6 is perpendicular to the output optical axis of the semiconductor laser 9, but is not so limited. Each beam of the semiconductor laser 9 is gathered by the transformation lens 3 and diffracted by the first transmission diffraction grating 4 to the second transmission diffraction grating 5. Each beam is combined at an identical position and an identical diffraction angle on the second transmission diffraction grating 5 to generate a combined beam. The combined beam from the second transmission diffraction grating 5 enters the output coupler 6 vertically and is outputted by the output coupler 6. An output optical axis of the semiconductor laser 1 of each of the modular laser input equipments 10 is parallel to each other. Similarly, by means of using the first transmission diffraction grating and the second transmission diffraction grating to be diffraction components, the present disclosure may enhance dispersion effect to twice. When the present disclosure is used to combine multiple beams of multiple semiconductor lasers, the spectral width can be reduced and more beam combining units can be added within a gain range of a semiconductor laser gain material and within a high efficient diffraction range of a grating, so as to enhance output power.

As mentioned in the above, the semiconductor laser beam combining device of the present disclosure enhances output power and brightness by combining multiple spectral beams and uses multiple grating structures to compress spectrum, such that the spectral width can be controlled within a gain range of a semiconductor gain medium and within a high efficient diffraction range of a grating.

While the present disclosure has been described by way of example and in terms of the embodiments, it is to be understood that the present disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor laser beam combining device comprising:

at least two modular laser input equipments, each of the modular laser input equipments comprising a semiconductor laser, a beam shaping component, a transformation lens, and a first diffraction grating arranged along an optical path in sequence, the semiconductor laser generating a beam, the semiconductor laser being located at a front focal point of the transformation lens, the first diffraction grating being located in front of a back focal point of the transformation lens;

a second diffraction grating, each beam being gathered by the transformation lens and diffracted by the first diffraction grating to the second diffraction grating, each beam being combined at an identical position and an identical diffraction angle on the second diffraction grating to generate a combined beam; and an output coupler, the combined beam from the second diffraction grating entering the output coupler vertically and being outputted by the output coupler.

2. The semiconductor laser beam combining device of claim 1, wherein an output optical axis of the semiconductor laser of each of the modular laser input equipments is parallel to each other.

3. The semiconductor laser beam combining device of claim 1, wherein the semiconductor laser is one selected from a group consisting of a single semiconductor laser beam emitting unit, a one-dimensional semiconductor laser bar array, and a two-dimensional semiconductor laser stack array.

4. The semiconductor laser beam combining device of claim 1, wherein the first diffraction grating and the second diffraction grating are transmission gratings.

5. The semiconductor laser beam combining device of claim 1, wherein the first diffraction grating and the second diffraction grating are reflection gratings.

6. The semiconductor laser beam combining device of claim 1, wherein the first diffraction grating is a transmission grating and the second diffraction grating is a reflection grating.

7. The semiconductor laser beam combining device of claim 1, wherein the first diffraction grating is a reflection grating and the second diffraction grating is a transmission grating.

8. The semiconductor laser beam combining device of claim 1, wherein an antireflection film is coated on a front surface of the semiconductor laser, a reflectivity of the antireflection film is smaller than 1%, a high reflective film is coated on a back surface of the semiconductor laser, and a reflectivity of the high reflective film is larger than 95%.

9. The semiconductor laser beam combining device of claim 1, wherein the beam shaping component is one selected from a group consisting of a fast axis collimator, a combination of a fast axis collimator and a slow axis collimator, and a combination of a fast axis collimator and a 45-degree tilted cylindrical lens.

10. The semiconductor laser beam combining device of claim 1, wherein a diffraction efficiency of the first diffraction grating and the second diffraction grating at 1 order or −1 order is larger than 90%.

11. The semiconductor laser beam combining device of claim 1, wherein the transformation lens is one selected from a group consisting of a single spherical cylindrical lens, a lens set consisting of multiple spherical cylindrical lenses, a single non-spherical cylindrical lens, and a lens set consisting of multiple non-spherical cylindrical lenses.

12. The semiconductor laser beam combining device of claim 1, wherein the output coupler is a partial reflector and a reflectivity of the output coupler is between 5% and 30%.

* * * * *